(12) United States Patent
Hashimoto et al.

(10) Patent No.: US 6,452,227 B2
(45) Date of Patent: Sep. 17, 2002

(54) SEMICONDUCTOR MEMORY DEVICE AND MANUFACTURING METHOD THEREOF

(75) Inventors: Hiroshi Hashimoto; Koji Takahashi, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 20 days.

(21) Appl. No.: 09/739,258

(22) Filed: Dec. 19, 2000

(30) Foreign Application Priority Data

Aug. 1, 2000 (JP) ........................................ 2000-233456

(51) Int. Cl.[7] ............................................ H01L 29/792
(52) U.S. Cl. ........................ 257/326; 257/296; 257/382
(58) Field of Search ................................ 257/296, 301, 257/316, 326, 384, 382

(56) References Cited

U.S. PATENT DOCUMENTS 6,168,985 B1 * 1/2001 Asano et al. ............... 438/241
6,359,301 B1 * 3/2002 Kuroda ....................... 257/306

FOREIGN PATENT DOCUMENTS

JP            10-98170        4/1998

* cited by examiner

Primary Examiner—Richard Elms
Assistant Examiner—Bradley Smith
(74) Attorney, Agent, or Firm—Armstrong, Westerman, & Hattori, LLP

(57) ABSTRACT

A semiconductor memory has a buried bit line structure. One end of the bit line and one end of the diffused impurity layer are connected by being overlapped with each other, and the surface of the source/drain of the selection transistor and the surface of the diffused impurity layer including the connecting portion are silicidized by using metals having high melting points, Ti and Si in this case, thereby forming the titanium silicide layer thereon. This invention not only solves the various problems arising from the buried bit line structure but also realizes sure formation of the silicide, low resistance, greater fineness and high speed operation.

8 Claims, 13 Drawing Sheets

SECTIONAL VIEW AT I – I' LINE

SECTIONAL VIEW OF MEMORY CELL PORTION AT II – II' LINE

SECTIONAL VIEW OF MEMORY CELL PORTION AT III – III' LINE

FIG.3 SECTIONAL VIEW CORRESPONDING TO I – I' LINE

FIG.3 SECTIONAL VIEW CORRESPONDING TO III – III' LINE

FIG.3 SECTIONAL VIEW CORRESPONDING TO I – I' LINE

FIG.3 SECTIONAL VIEW AT I – I' LINE

FIG.3 SECTIONAL VIEW AT IV – IV' LINE

FIG.3 SECTIONAL VIEW CORRESPONDING TO I – I' LINE

FIG.3 SECTIONAL VIEW CORRESPONDING TO III – III' LINE

FIG.3 SECTIONAL VIEW CORRESPONDING TO I – I' LINE

FIG.3 SECTIONAL VIEW CORRESPONDING TO I – I' LINE

FIG.3 SECTIONAL VIEW CORRESPONDING TO III – III' LINE

SECTIONAL VIEW AT I – I' LINE

FIG.9 SECTIONAL VIEW CORRESPONDING TO I – I' LINE

FIG.9 SECTIONAL VIEW CORRESPONDING TO I – I' LINE

FIG.9 SECTIONAL VIEW CORRESPONDING TO I – I' LINE

FIG.9 SECTIONAL VIEW CORRESPONDING TO III – III' LINE

FIG.9 SECTIONAL VIEW CORRESPONDING TO I – I' LINE

FIG.9 SECTIONAL VIEW CORRESPONDING TO I – I' LINE

FIG.9 SECTIONAL VIEW CORRESPONDING TO IV – IV' LINE

FIG.9 SECTIONAL VIEW CORRESPONDING TO I – I' LINE

FIG.9 SECTIONAL VIEW AT III – III' LINE

FIG.9 SECTIONAL VIEW CORRESPONDING TO I – I' LINE

FIG.9 SECTIONAL VIEW CORRESPONDING TO I – I' LINE

FIG.9 SECTIONAL VIEW CORRESPONDING TO III – III' LINE

SEMICONDUCTOR MEMORY DEVICE AND MANUFACTURING METHOD THEREOF

CROSS-REFERENCE TO RELATED APPLICATIONS

This application is based upon and claims priority of Japanese Patent Application No. 2000-233456, filed on Aug. 1, 2000, the contents being incorporated herein by reference.

BACKGROUND OF THE INVENTION

1. Field of the Invention

The present invention relates to a semiconductor memory device having its bit line composed of a buried diffused impurity layer and a manufacturing method thereof, particularly to a silicidized semiconductor memory of mixed package type comprising a peripheral circuit area and a logic circuit area of a memory cell area.

2. Description of the Related Art

Non-volatile semiconductor memories designed for maintaining their stored information even when disconnected from their power sources, include EPROM, flash EPROM and the like, while logic semiconductor devices include MPU, MCU and the like, and it has been customary to manufacture them separately.

Concerning the non-volatile memory, the research and development of silicidized structures for further fining and further speeding of operation is in progress rapidly. On the other hand, from the similar reason, the transistors for logic circuit have also become to adopt the silicidized structure for the source/drain or the silicidized structure for the source/drain and the gate electrode (salicide structure).

Recently, the research and development of the mixed package semiconductor, characterized by having the non-volatile memory and the logic semiconductor device on a common substrate, is in progress rapidly. In consequence, it has become necessary even for the conventional mixed package semiconductor system to be silicidized.

The non-volatile memory, capable of making electrical writing and erasing, comprises a memory cell array area, a peripheral circuit area and a connection area and is formed on a substrate for semiconductor; however, the mixed package type semiconductor system further comprises a logic area including an SRAM or the like in addition to the above-mentioned components.

Concerning the memory cell array of the non-volatile memory, it has become necessary to reduce the number of steps of the manufacturing process thereof, and, as a suitable means for satisfying such a requirement, the buried bit line structure characterized by forming the diffused impurity layer on the surface of the substrate has been proposed.

Here, an example of conventional non-volatile memory, in which the memory cell array area has a buried bit line structure.

FIG. 1 is a schematic sectional view showing a memory cell of the memory cell array area and the selection transistor of the peripheral circuit area constituting the non-volatile memory having the buried bit-line structure.

The memory cell and the selection transistor are separated by a field oxidation film 108; in the memory cell, as shown in FIG. 2 for example, a first oxide film 120, a charge storage silicon nitride film 121, a second oxide film 122 and a word line (WL) 102 are accumulated sequentially on a semiconductor substrate 101 to form a gate electrode structure; in the selection transistor, a gate insulating film 111 and a gate electrode 112 are sequentially accumulated on the semiconductor substrate 101 to form a gate electrode structure.

In the memory cell, a bit line (BL) 103 is formed by ion implantation of impurities on a silicon substrate 101; an insulation layer 104 is formed on the bit line 103 by means of thermal oxidation; the bit line 103 and a word line 102 are separated by the insulation layer 104; the bit line 103 and source/drain 113 of the selection transistor 103 are connected to each other by a metal wiring 107 through a contact hole 105 opening on the surface of the bit line 103 and a contact hole 106 opening on the surface of the source/drain 113, which are provided passing through the insulation layer 104 respectively.

Next, in the case of a non-volatile memory having a floating gate and a control gate disclosed in Japanese Patent Application Laid-Open No. 10-98170, the peripheral circuit and the bit line are connected by providing an impurity area.

In the case of the above-mentioned conventional non-volatile memory, if the memory cell array area is silicidized, this will cause a short circuit of the adjacent bit line 103 because of the presence of the silicide, and so only the peripheral circuit area, not including the bit line 103, is silicidized. Therefore, in this case, only the memory cell array area is masked, but this process gives rise to a problem such as the complication of the manufacturing process.

Further, in the above case, in forming the metal wiring 107, in the contact hole 105 of the memory cell, the surface of the unsilicidized bit line 103 is exposed, while in the contact hole 106, the surface of the silicidized source/drain 113 is exposed. Thus, when forming the metal wiring 107, one of the contact holes has its silicidized surface exposed while the other contact hole has its silicon substrate exposed. Therefore, one contact hole having the silicide exposed and the other contact hole having the substrate exposed exist concurrently, and so the before-burying treatment of the contact hole 106 on the silicidized side causes not only the damage to the exposed portion of the contact hole 105 on non-silicidized side but also the resultant poor contact and insufficient resistance.

SUMMARY OF THE INVENTION

An object of the present invention, made in consideration of the aforesaid problem of the related art, is not only to enable silicide in a buried bit line structure only for the peripheral circuit area (and logic circuit area) to be formed with ease and with reduced number of steps but also to resolve the problem resulting from the positional difference in the exposed portion of the opening between the two contact holes by connecting the memory cell array area and the peripheral circuit area (and the logic circuit area) with the second diffused impurity layer. Further, since the overlapped portion of the first diffused impurity layer and the second diffused impurity layer produces a high resistance, the silicide is formed to suppress the rise of the resistance. Such a high resistance results from that ions injected for forming the second diffused impurity layer will not sufficiently reach the end of the first diffused impurity layer because of the presence of the insulation layer formed on the top of the first diffused impurity layer, causing the formation of a narrow overlapped portion and resultant high resistance.

As mentioned above, an object of the present invention is to provide a highly reliable semiconductor memory and a manufacturing method thereof, which are designed for solving various problems resulting from the buried-bit-line structure and realizing a lower resistance, a higher fineness and operation at a higher speed.

The present inventor has arrived at the embodiments of the present invention given below by deliberately analyzing the present invention.

The present invention relates to a semiconductor memory device and a manufacturing method thereof, the semiconductor memory device having a so-called buried-bit-line structure, wherein the word line and the bit line intersect through the insulation layer to form the memory cell array area and the peripheral circuit area (a logical circuit area comprising a necessary transistor may be included additionally), and the first diffused impurity layer formed under the insulation layer.

The semiconductor memory according to the present invention is characterized in that a second diffused impurity layer is formed partially overlapping with one end of the first diffused impurity layer and that a silicide is formed on the surface of a third diffused impurity layer forming the surface layer of the second diffused impurity layer, including the overlapped portion, and the source/drain of the selection transistor.

In this case, a part of the second diffused impurity layer may be formed either commonly with or independently of one of the third diffused impurity layers, which constitute the source/drain.

For the memory cell and the selection transistor, the second diffused impurity layer and the third diffused impurity layer are connected by wiring through the silicide.

Further, the memory cell and the selection transistor have the silicide formed on their surfaces respectively and are connected to each other by metal wiring.

Further, the peripheral circuit area is formed with the silicide, and the surface of the diffused impurity layer of the memory cell array area is not silicidized.

The manufacturing method of the semiconductor memory device according to the present invention comprises the following steps.

That is, the manufacturing method comprises a step for marking off a first element forming area of the peripheral circuit area and/or the logic circuit area and a second element forming area of the memory cell on the semiconductor substrate, a step for patterning, into predetermined forms, a first silicon dioxide film, a storage silicon nitride film and a second silicon dioxide film exclusively for the first element forming area after accumulating the first silicon dioxide film, the storage silicon nitride film and the second silicon dioxide film on the first and the second element forming areas, a step for forming an insulation layer over the first diffused impurity layer after forming the first diffused impurity layer to serve as a bit line by selectively introducing impurities into the second element forming area, a step for removing the first silicon dioxide film, the storage silicon nitride film and the second silicon dioxide film only from the first element forming area and the connecting portion between the first element forming area and the second element forming area, a step for forming a gate insulating film in the first element forming area, a step for forming a gate electrode on the gate insulating film of the first element forming area and the word line on the first silicon dioxide film, the storage silicon nitride film and the second silicon dioxide film in the second element forming area by patterning the silicon film after forming a silicon film on the first element forming area and the second element forming area, a step for forming the second diffused impurity layer with its one end overlapping with one end of the first diffused impurity layer to be connected on the connecting portion and for forming the third diffused impurity layer to serve as the source/drain in the first element forming area, by introducing impurities into the connecting portion and the first element forming area, and a step for forming a silicide on the surface of the second diffused impurity layer including the overlapping portion and on the surface of the third diffused impurity layer forming the source/drain of the selection transistor.

In the above case, a part of the second diffused impurity layer may be formed either integrally with one end of the third diffused impurity layer or independently of it.

According to the present invention, the buried-bit-line structure not only enables the formation of the silicide exclusively for the peripheral circuit area (and the logic circuit area) to be made with ease and with less number of steps but also makes it possible to solve the problem arising from the positional difference in the exposed portion of the opening between the contact hole of the memory cell array area and the contact hole of the peripheral circuit area by connecting both by the second diffused impurity layer. Further, the silicide can also be formed on the overlapping portion, which forms the bit line between the first diffused impurity layer and the second diffused impurity layer, to suppress the rise of resistance. In this way, the present invention is capable of realizing a highly reliable semiconductor memory by solving various problems arising from the buried-bit-line structure by assuring the formation of the silicide leading to a higher fineness, a higher operation speed, a smaller resistance.

DETAILED DESCRIPTION OF THE PREFERRED EMBODIMENTS

Hereinafter, preferred embodiments of the present invention will be described in detail with reference to drawings.

First Embodiment

First, the explanation will be made as to the first embodiment of the present invention. A non-volatile semiconductor memory (non-volatile memory) is of a buried-bit-line structure with silicide formed only for a peripheral circuit area and a logic circuit area in a memory cell array area.

Figure 1:
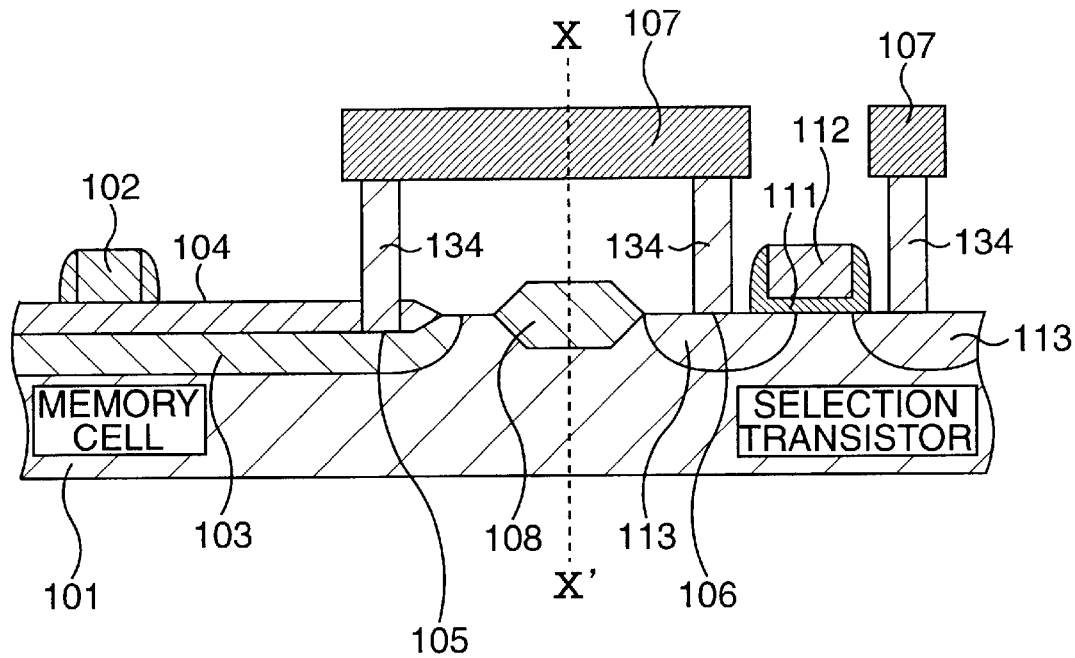
FIG. 1 is a schematic sectional view showing a conventional non-volatile memory.
Figure 2:
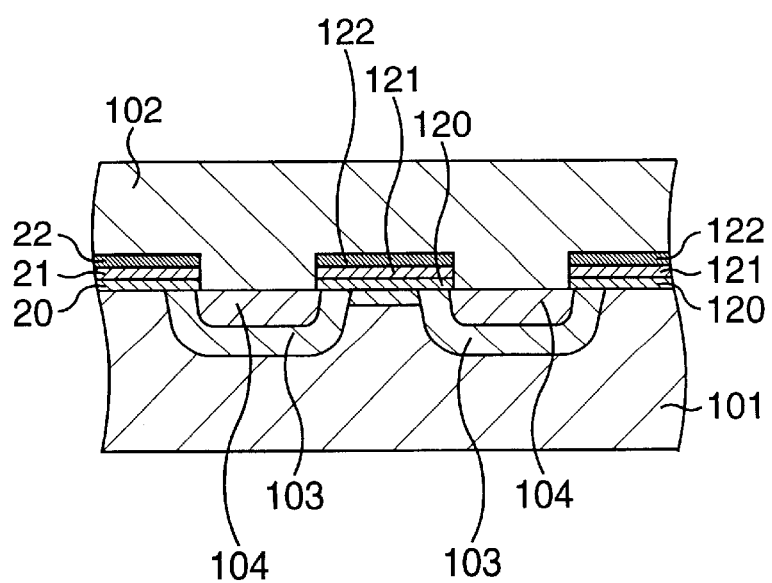
FIG. 2 is a schematic sectional view along a word line of a memory cell of the conventional non-volatile memory.
Figure 3:
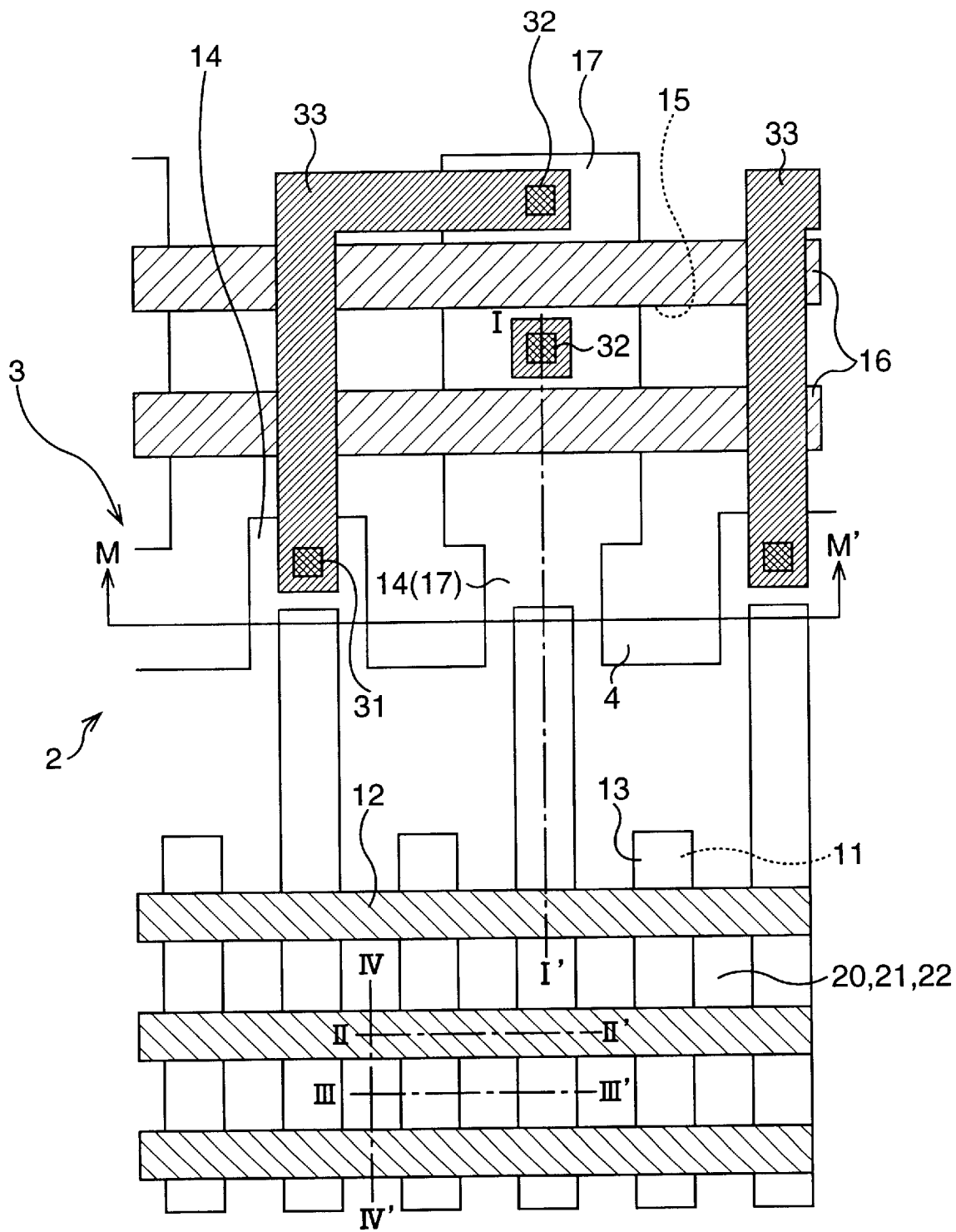
FIG. 3 is a schematic plan view of a non-volatile memory according to the first embodiment of the present invention.
Figure 4A:
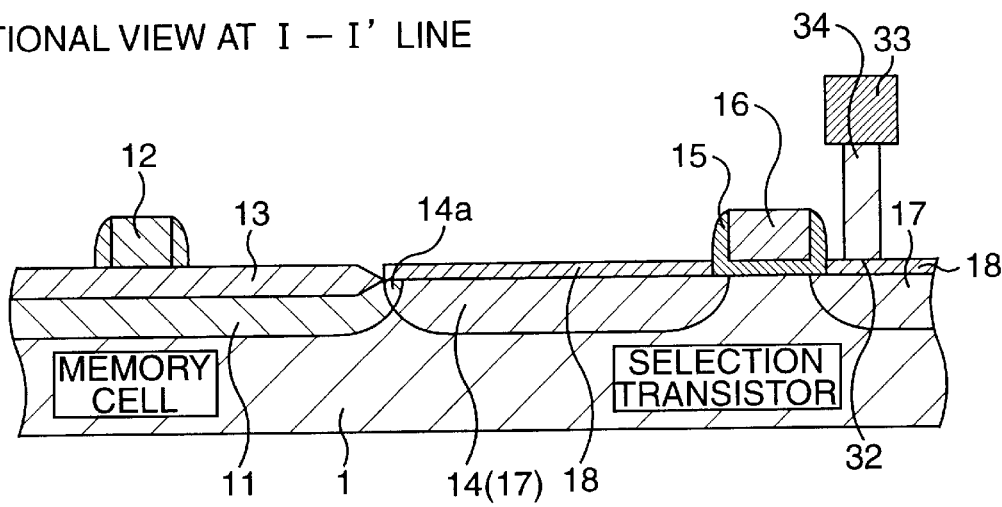
FIG. 4A is a schematic sectional view along I–I' line of the non-volatile memory according to the first embodiment shown in FIG. 3.
Figure 4B:
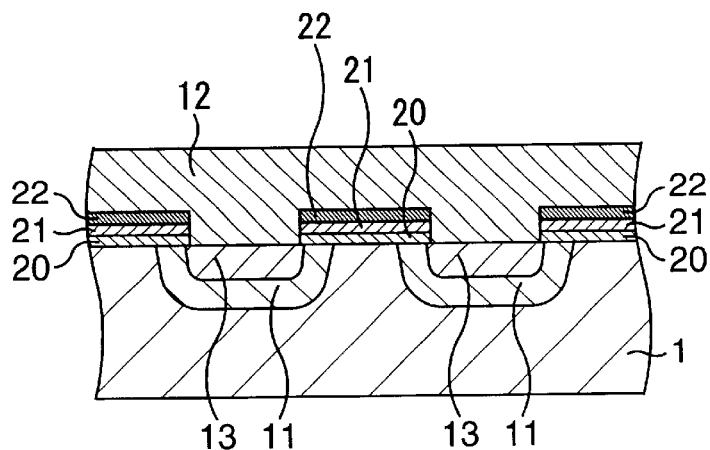
FIG. 4B is a schematic sectional view along II–II' line of the non-volatile memory according to the first embodiment shown in FIG. 3.
Figure 4C:
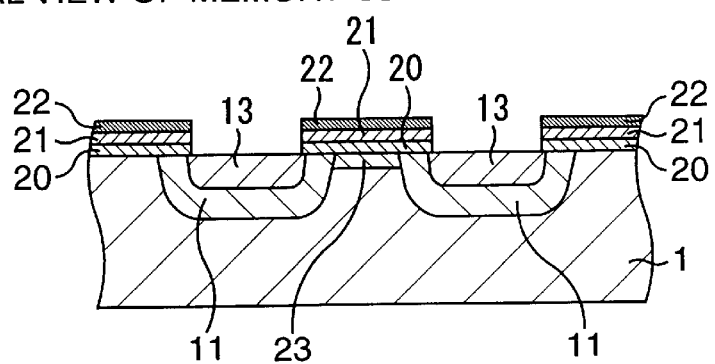
FIG. 4C is a schematic sectional view along III–III' line of the non-volatile memory according to the first embodiment shown in FIG. 3.

FIG. 3 is a plan view of the non-volatile memory according to the first embodiment of the present invention showing the boundary and its vicinity between the memory cell array area and the peripheral circuit area. FIG. 4A is a schematic sectional view along I–I' line in FIG. 3; FIG. 4B is a schematic sectional view along II–II' line in FIG. 3; FIG. 4C is a schematic sectional view along III–III' line in FIG. 3.

This non-volatile memory comprises a p-type silicon substrate 1 having a memory cell array area 2 and a peripheral circuit area 3 (and a logic circuit area: not shown) formed thereon, both of them being separated by a field silicon dioxide film 4. In the case of this memory, a so-called SOI (Silicon On Insulator) substrate may be substituted for the silicon substrate 1 in order to reduce parasitic capacity for the operation at higher speed.

In the memory cell array area 2, a bit line 11 and a word line 12 intersect each other (orthogonally) through an insulation layer 13, and each memory cell is formed at each intersecting portion. The bit line 11 is formed on the surface of the silicon substrate 1 as a diffused impurity layer, which contains impurities, e.g., arsenic (As) in this case, introduced by ion implantation method and is also provided with an insulation layer 13 formed thereon by thermal oxidation method in order to secure the insulation between the bit line 11 and the word line 12. A first silicon dioxide film 20, a storage silicon nitride film 21 and a second silicon dioxide film 22 are accumulated between neighboring bit lines 11 to secure necessary insulation. It is sufficient for the neighboring bit lines 11 to be insulated by any one of the films 20–22, but in this embodiment, all the films are placed between the bit lines 11.

The gate electrode structure of the memory cell comprises the first silicon dioxide film 20, the storage silicon nitride film 21 and the connecting portion where the second silicon dioxide film 22 and the word line 12 intersect with each other. In this memory cell, the bit line 11 also serves as source/drain, while the storage silicon nitride film 21 stores and discharge electric charges so that the memory cell functions as a memory.

Further, as shown in FIG. 4C, in order to control the threshold value of the surface layer of the silicon substrate 1 at immediately beneath the first silicon dioxide film 20, a channel stopper layer 23 may be formed with p-type impurities by using ion implantation method.

On the other hand, the peripheral circuit area 3 comprises selection transistors, which are formed with a gate electrode 16 patterned on a gate insulating film 15, while n-type impurities, e.g., arsenic (As) in this case, are introduced into the surface layer of the silicon substrate 1 at both sides of the gate electrode 16 by ion implantation method to form source/drain 17.

In this embodiment, the first silicon dioxide film 20, the storage silicon nitride film 21 and the second silicon dioxide film 22 are formed only on the memory cell array 2 (the lower side in FIG. 3) bordered by a segment M–M' of FIG. 3, while the diffused impurity layer 14, which contains n-type impurities, e.g., arsenic (As) in this case, introduced into the surface layer of the silicon substrate 1 by ion implantation method, is formed on the connecting portion of the memory cell array area 2 and the peripheral circuit area 3 bordered by the segment M–M', which corresponds to the upper side in FIG. 3. This diffused impurity layer 14 partially serves as the source/drain 17 of the selection transistor.

In this embodiment, as shown in FIG. 4A, the bit line 11 and the diffused impurity layer 14 are connected through their respective one ends overlapping with each other, and the silicide of metals having high melting points, i.e., a titanic silicide layer 18 composed of Ti and Si in this case, is formed on the surface layer of the source/drain 17 of the selection transistor in the peripheral circuit area 3 bordered by the segment M–M', that is, the upper area in the case shown in FIG. 3.

Then, as shown in FIG. 3 and FIG. 4A, a contact hole 31, for partially exposing the titanic silicide layer 18 on the diffused impurity layer 14 to an insulating interlayer 19 covering the whole surface and a BPSG film 35, and the contact hole 32, for partially exposing the surface of the titanic silicide layer 18 on the source/drain 17 are formed, while a tungsten (W) plug 34 for filling these (holes) formed is followed by the metal wiring 33 formed by patterning for connecting the bit line 11 and the selection transistor to each other through the diffused impurity layer 14 and the source/drain 17.

This embodiment is concerned with a case where the diffused impurity layer 14 and the source/drain 17 of the selection transistor are silicidized but also suited for silicidization of the diffused impurity layer in the logic circuit area and the polysilicidization of various gates.

A manufacturing process of the non-volatile memory according to this embodiment will be described in the following. FIG. 5A to FIG. 8B are the schematic sectional views sequentially showing steps of the manufacturing process of the non-volatile memory according to this embodiment. Here, each of the pairs FIG. 5B and FIG. 5C, FIG. 6B and FIG. 6C, FIG. 7A and FIG. 7B, and FIG. 8A and FIG. 8B shows different sections relating to the same step of the process, respectively.

First, a field oxidation film 4 of a thickness of 200 nm–500 nm (see FIG. 4A) for separating the memory cell array area 2 from the peripheral circuit area 3 is formed on the surface of the p-type silicon substrate 1 (SOI substrate may be substituted) by selective oxidation method and LOCOS method. In this process, so-called STI (Shallow Trench Isolation) element isolation method may be employed, in which a groove is formed in the element isolation area to embed an insulator into the groove.

Figure 5A:
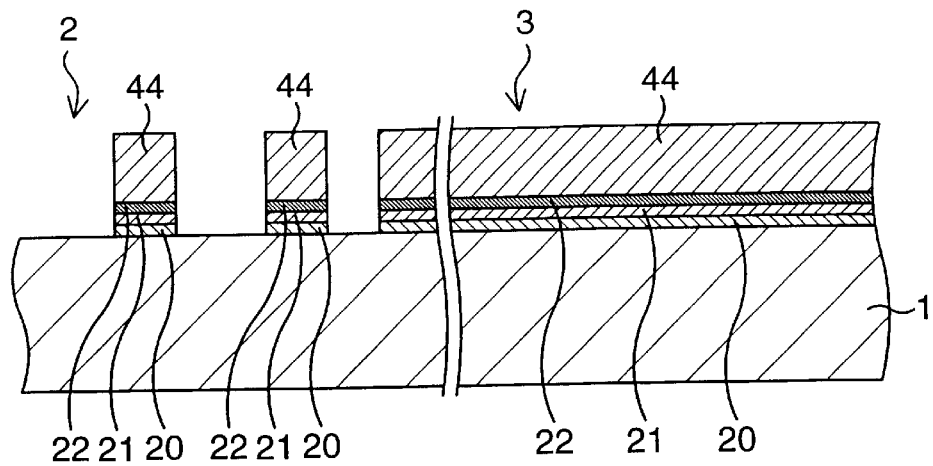
FIG. 5A is a schematic sectional view showing a manufacturing process of the non-volatile memory according to the first embodiment.

Next, as shown in FIG. 5A, a first silicon dioxide film 20 covering the whole surface to a thickness of 5 nm–10 nm at 900° C. by thermal oxidation method, a storage silicon nitride film to a thickness of 6 nm–12 nm by CVD method, and a second silicon dioxide film to a thickness of 4 nm–10 nm by thermal oxidation method at 1000° C. are formed in the given order, while a resist pattern 44 is formed on the memory cell array area 2 leaving a partial opening (in this case, the oblique ion implantation may be applied onto the surface of the substrate 1 by using boron (B) with an accelerating energy of 60 keV and a dose of $2 \times 10^{13}$–$5 \times 10^{13}$/cm$^2$) and the first silicon dioxide film 20, the silicon nitride film 20, the storage silicon nitride film 21 and the second silicon dioxide film 22 are formed by dry etching.

Figure 5B:
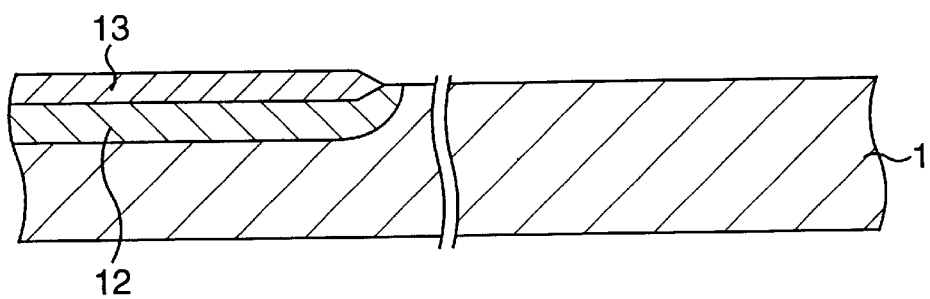
FIG. 5B is a schematic sectional view along I–I' line showing a manufacturing process of the non-volatile memory according to the first embodiment subsequent to that of FIG. 5A.
Figure 5C:
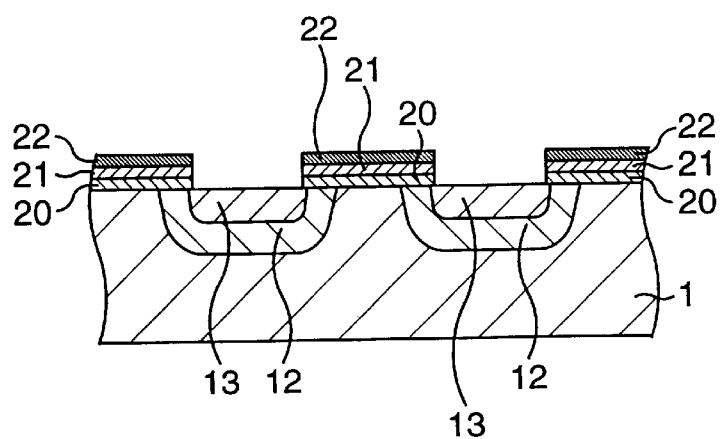
FIG. 5C is a schematic sectional view along III–III' line showing a manufacturing process of the non-volatile memory according to the first embodiment subsequent to that of FIG. 5A.

Subsequently, as shown in FIG. 5B and FIG. 5C, in order to form a bit line 11, which also serves as source/drain, by using the resist pattern 44 as a mask, n-type impurities, e.g., arsenic (As) in this case, is injected by ion implantation method with an accelerating energy of 50 keV and a dose of $2 \times 10^{15}$–$5 \times 10^{15}$/cm$^2$. Then, the resist pattern 44 is removed, and the insulation layer 4 is formed on the bit line 11 to a thickness of about 50 nm–200 nm at 800° C.

Then, dry etching is applied only to the areas of the first silicon dioxide film 20, the storage silicon nitride film 21 and the second silicon dioxide film 22 covered by the peripheral circuit area 3 (upper area in FIG. 3) including the connecting portion between the memory cell array area 2 and the peripheral circuit area 3 bordered by the segment M–M' in FIG. 3. Thus, these parts 20–22 are left on the memory cell array 2 not including aforementioned part thereof.

Figure 6A:
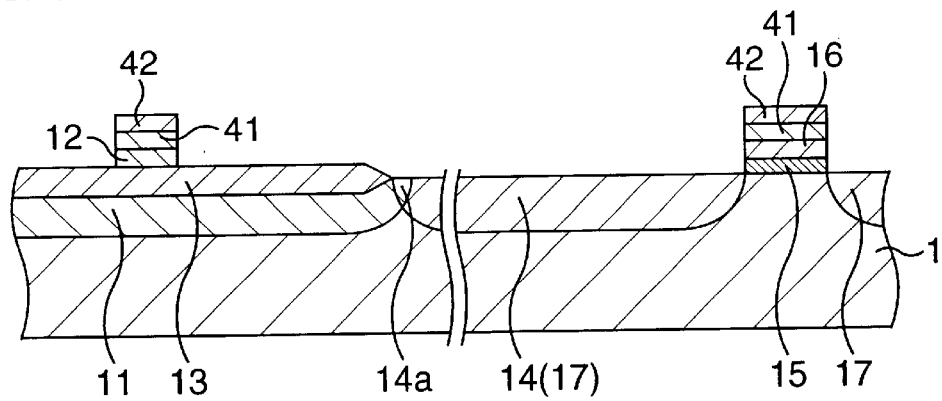
FIG. 6A is a schematic sectional view along I–I' line showing a manufacturing process of the non-volatile memory according to the first embodiment subsequent to that of FIG. 5B (FIG. 5C)

Subsequently, as shown in FIG. 6A, after forming a gate insulating film 15 on the peripheral circuit area 2 to a thickness of 5 nm–150 nm at 900° C. by thermal oxidation method, polycrystalline silicon films to form the word line 12 and the gate electrode 16 are accumulated on the whole surface to a thickness of about 70 nm–150 nm and is doped with n-type impurities, e.g., phosphorus (P) in this case, so that a resistance value of about 1000 Ω.cm can be obtained. In this case, an amorphous silicon film doped with phosphorus may be substituted for the polycrystalline silicon film. Then, a tungsten silicide film 41 of a thickness of about 100 nm–180 nm is formed thereon, and, further, a (plasma-nitrified) silicon dioxide film 42 for preventing the reflection from the resist is formed thereon to a thickness of about 30 nm–150 nm, followed by resist patterning. Then, dry etching is applied to the polycrystalline silicon film, the tungsten silicide film 41 and the (plasma-nitrified) silicon dioxide film 42.

Subsequently, in order to form a diffused impurity layer 14 and the source/drain 17 of the selection transistor on the connecting portion between the memory cell array area 2 and the peripheral circuit area 3, ion implantation is made by using n-type impurities, e.g., phosphorus (P) in this case, at an accelerating energy of 40 kev and a dose of $2 \times 10^{13}$–$4 \times 10^{13}$/cm$^2$.

Figure 6B:
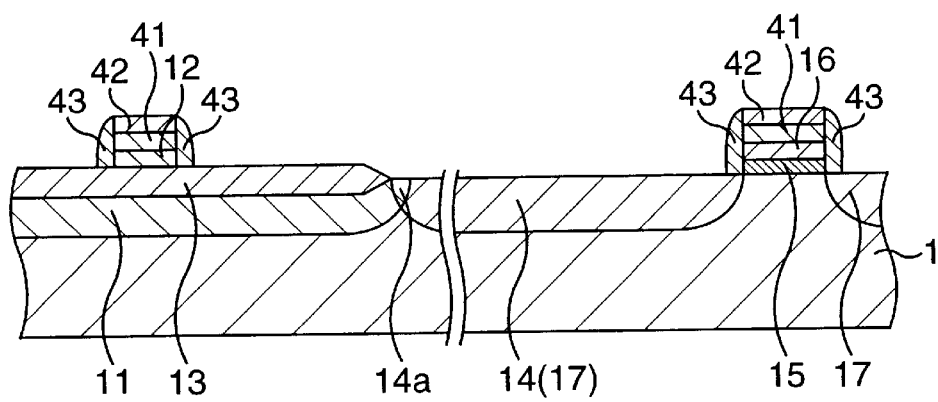
FIG. 6B is a schematic sectional view along I–I' line showing a manufacturing process of the non-volatile memory according to the first embodiment subsequent to that of FIG. 6A.
Figure 6C:
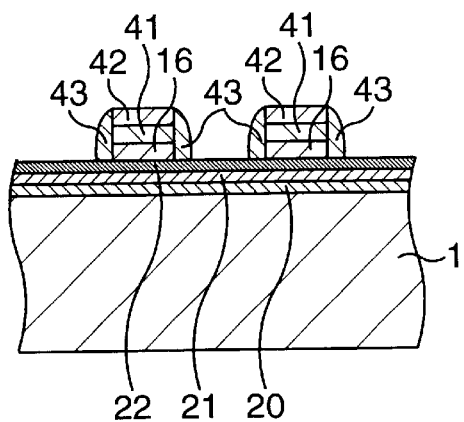
FIG. 6C is a schematic sectional view along IV–IV' line showing a manufacturing process of the non-volatile memory according to the first embodiment subsequent to that of FIG. 6A.

Subsequently, as shown in FIG. 6B, after accumulating a silicon dioxide film covering the whole surface to a thickness of about 70 nm–150 nm by CVD method, a side-wall spacer 43 is formed by applying anisotropic etching (etchback) to the whole surface. In this case, as shown in FIG. 6C, on IV–IV' line of the memory cell, more than one of the insulating films of the first silicon dioxide film 20, the storage silicon nitride film 21 and the second silicon dioxide film 22 are maintained.

Subsequently, the diffused impurity layer 14 and the selection transistor are formed on the connecting portion of the memory cell array area 2 and the peripheral circuit area 3 by applying high-concentration ion implantation by using n-type impurities, e.g., arsenic (As) in this case, with an accelerating energy of 60keV and at a dose of $2 \times 10^{15}$–$4 \times 10^{15}$/cm$^2$. In this case, one end of the diffused impurity layer forming the bit line 11 and one end of the source/drain 17 (the source/drain 17 serve also as the diffused impurity layer 14 in this case) are overlapped when connected to each other.

Figure 7A:
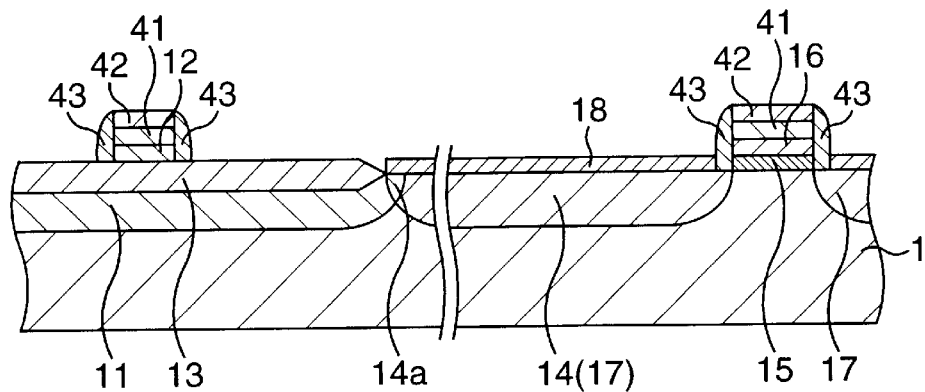
FIG. 7A is a schematic sectional view along I–I' line showing a manufacturing process of the non-volatile memory according to the first embodiment subsequent to that of FIG. 6B (FIG. 6C)

Subsequently, as shown in FIG. 7A, a metal having a high melting point, e.g., titanium (Ti) in this case, is formed into a film having a thickness of about 20 nm–30 nm by sputtering method. Then, after Si and Ti are made to react with each other at, for example, 700° C., and the portion left without reaction is subjected to etch-back process and is subjected to a heat treatment at 800° C. to form a titanium-silicide layer 18 on the surface of the diffused impurity layer 14 and the surface of the source/drain 17. In this case, a cobalt-silicide layer may be substituted for the titanium-silicide layer.

Figure 7B:
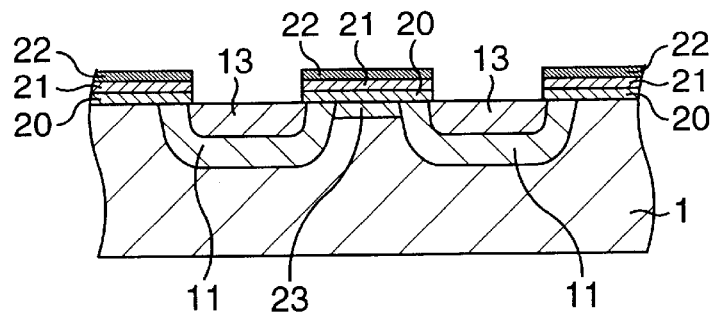
FIG. 7B is a schematic sectional view along III–III' line showing a manufacturing process of the non-volatile memory according to the first embodiment subsequent to that of FIG. 6B (FIG. 6C)

In this embodiment, as shown in FIG. 7B, since one of the insulating films of the first silicon dioxide film 20, the storage silicon nitride film 21 and the second silicon dioxide film 22 remains in the memory cell array 2 on the III–III' line (between the neighboring bit lines), the silicide will not be formed on the memory cell array area 2.

Figure 7C:
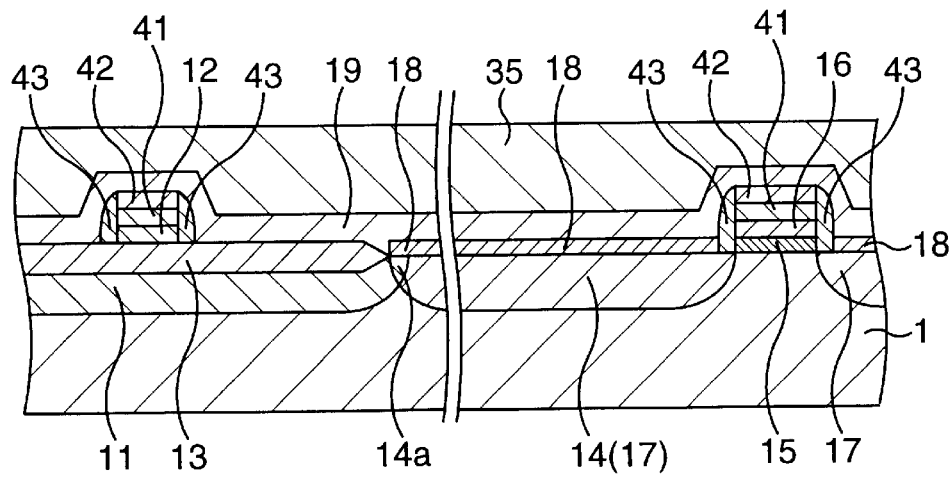
FIG. 7C is a schematic sectional view along I–I' line showing a manufacturing process of the non-volatile memory according to the first embodiment subsequent to that of FIG. 7A (FIG. 7B)

Then, as shown in FIG. 7C, an insulating interlayer 19 having a thickness of about 50 nm–150 nm and a BPSG film 35 having a thickness of about 400 nm–1000 nm are formed respectively on the whole surface, by CVD method.

Figure 8A:
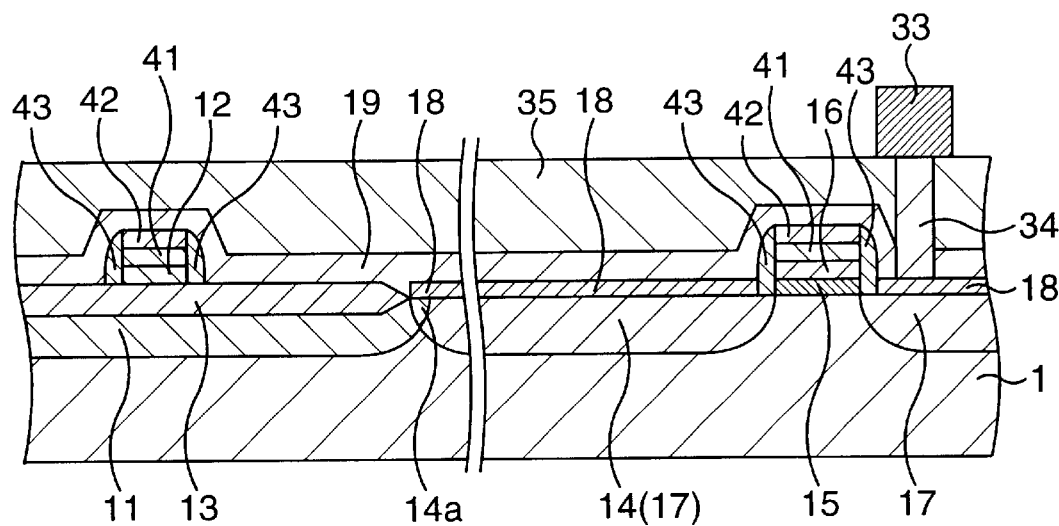
FIG. 8A is a schematic sectional view along I–I' line showing a manufacturing process of the non-volatile memory according to the first embodiment subsequent to that of FIG. 7C.
Figure 8B:
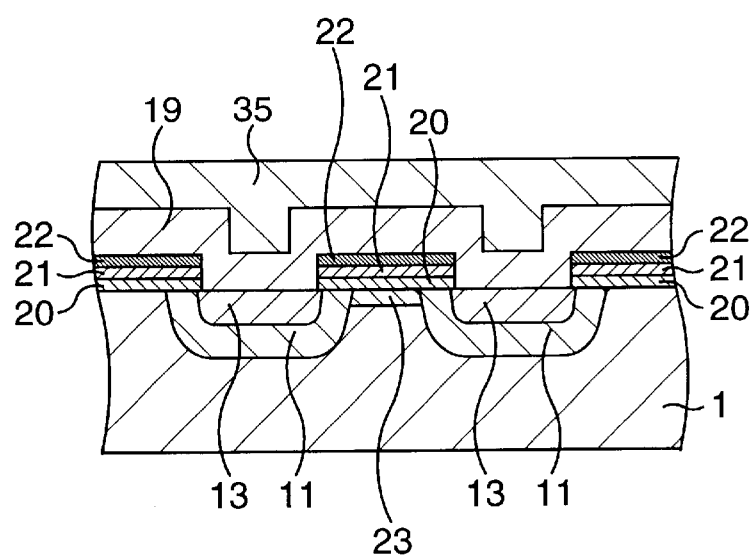
FIG. 8B is a schematic sectional view along III–III' line showing a manufacturing process of the non-volatile memory according to the first embodiment subsequent to that of FIG. 7C.

Subsequently, as shown in FIG. 8A and FIG. 8B, after applying resist patterning, contact holes 31 and 32 are formed through a dry etching process, followed by formation of a tungsten plug 34 for embedding and formation of metal wiring 33 by using an aluminum alloy.

Then, similarly to the case of an ordinary MOS integrated circuit, multilayer metal wiring is made, and then the surface passivation film is formed to complete a non-volatile memory.

As described in the foregoing, the buried bit line structure according to the present invention not only enables silicide to be formed exclusively for the peripheral circuit area 3 (and the logic circuit area) with ease an d with less number of steps but also prevents the problem relating to the contact holes 31 and 32, which may occur when connecting the memory cell array area 2 and the peripheral circuit area 3 with each other through the diffused impurity layer 14, since the exposed portions of the openings of both the contact holes 31 and 32 are respectively covered with the silicide layer. Further, since the silicide is formed on the overlapping portion of the diffused impurity layer constituting the bit line 11 and the diffused impurity layer 14, the increase in resistance can be suppressed. As is described in the foregoing, this embodiment not only solves various problems arising from the buried bit line structure for sure formation of the silicide but also realizes a non-volatile memory assuring a high reliability, a low resistance, a higher fineness and a higher operating speed.

Second Embodiment

The second embodiment of the present invention will be explained in the following. Similarly to the case of the first embodiment, the second embodiment is also concerned with a non-volatile memory having a buried bit line structure, but the latter differs from the former with respect to the fashion in which the connection between the memory cell array area and the peripheral circuit area is made.

Figure 9:
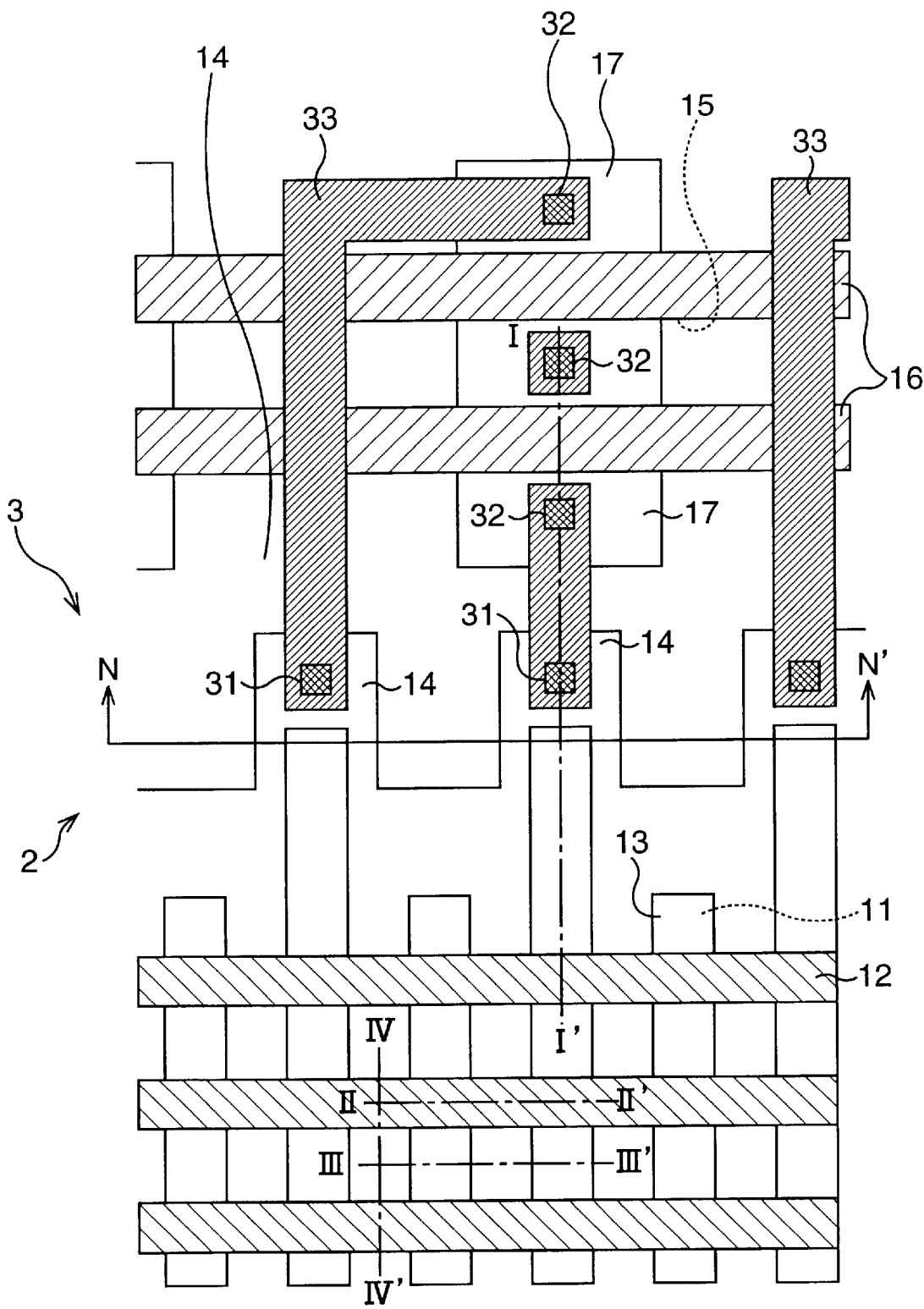
FIG. 9 is a schematic plan view showing a non-volatile memory according to the second embodiment of the present invention.
Figure 10:
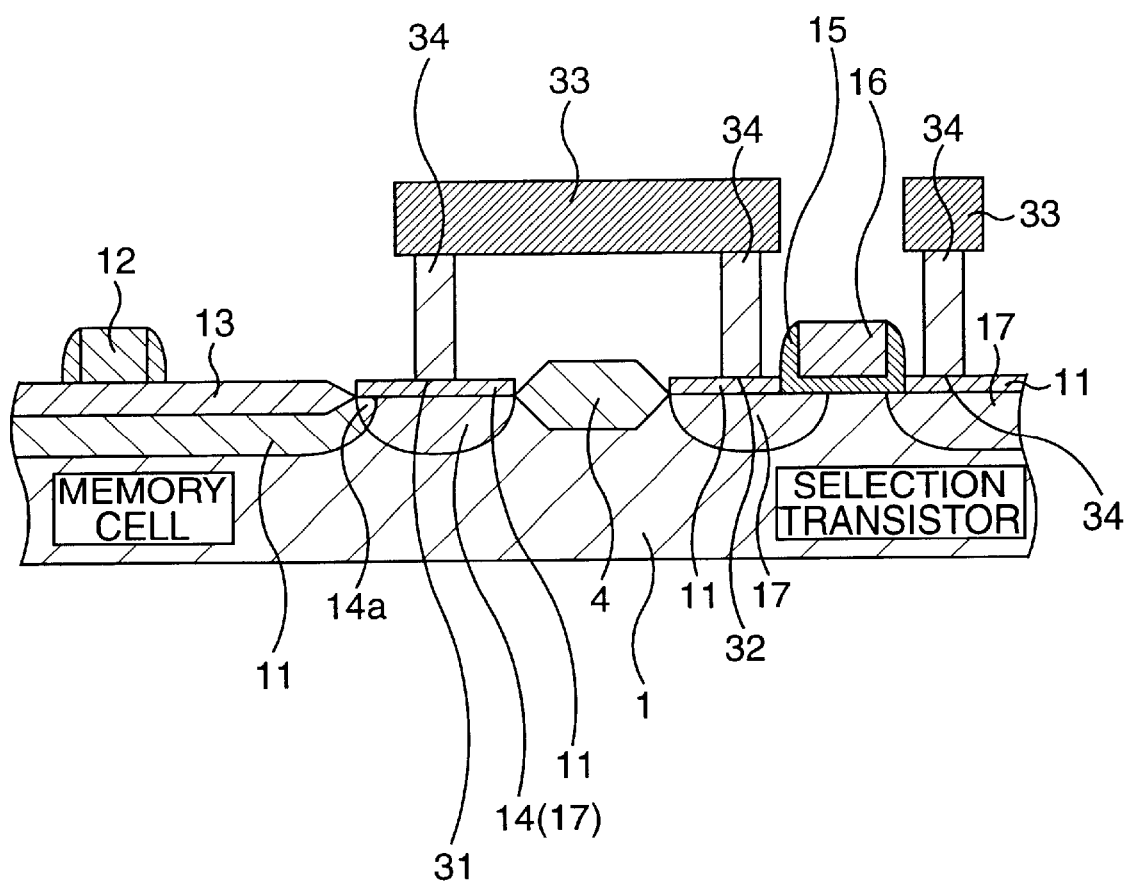
FIG. 10 is a schematic sectional view along I–I' line of the non-volatile memory according to the second embodiment.

FIG. 9 is a schematic plan view showing a non-volatile memory according to this embodiment, particularly the portion near the border of the memory cell array area and the peripheral circuit area. FIG. 10 is a schematic sectional view along I–I' line in FIG. 9. Further, in this embodiment, parts common to those described in the first embodiment are assigned common numerals and letters.

Similarly to the case of the first embodiment, the non-volatile memory according to this embodiment comprises a memory cell array area 2 and a peripheral circuit area 3 (and a logic circuit area: not shown), which are separated by a field silicon dioxide film 4. However, the second embodiment differs from the first embodiment in that both are completely separated by the field silicon dioxide film 4.

Further, also in the case of this embodiment, in the memory cell array area 2, a bit line 11 and a word line 12 intersect (orthogonally) each other through an insulation layer 13, and each memory is formed on each intersecting portion. The bit line 11 is formed on the silicon substrate 1 as a diffused impurity layer created by ion implantation with n-type impurities, and the insulation layer 13 is formed on the bit line through a thermal oxidation process to secure the insulation between the bit line 11 and the word line 12. A first silicon dioxide film 20, a storage silicon nitride film 21 and a second silicon dioxide film 22 are accumulated between neighboring bit lines to secure insulation.

The gate electrode of the memory cell comprises the first silicon dioxide film 20, the storage silicon nitride film 21 and the intersecting portion of the second silicon dioxide film 22 and the word line 12. In this memory cell, the bit line 11 serves also as the source/drain, whereby the storage silicon nitride film 21 stores and discharges electric charges to function as a memory.

On the other hand, the peripheral circuit area 3 comprises selection transistors, each selection transistor comprising a gate insulating film 15 and an electrode 16 formed thereon by patterning process, and source/drain 17 formed by injecting n-type impurities into the surface layer of the silicon substrate 1 on both sides of the gate electrode 16 through an ion implantation process.

According to this embodiment, the first silicon dioxide film 20, the storage silicon nitride film 21 and the second silicon dioxide film 22 are formed only on the side of the memory cell array area 2 (lower side in FIG. 9) bordered by the segment N–N' in FIG. 9, while the diffused impurity layer 14, created by injecting n-type impurities, e.g., arsenic (As) in this case, into the surface layer of the silicon substrate 1 through a ion implantation process, is formed on the connecting portion between the memory cell array area 2 and the peripheral circuit area 3 (upper side in FIG. 9) bordered by the segment N–N'. This diffused impurity layer 14 partially functions as the source/drain 17 of the selection transistor. In this embodiment, the connecting portion, i.e., the diffused impurity layer 14 is provided on the side of the memory cell array area 2, which is separated by the field silicon dioxide film 4.

In this embodiment, as shown in FIG. 10, one end of the bit line 11 and one end of the diffused impurity layer 14 are connected with each other by being overlapped with each other; the silicide layer 18, formed by silicidizing metals having high melting points, e.g., Ti and Si in this case, is provided on the surface of the diffused impurity layer 14 including the surface layer of the source/drain 17 of the selection transistor and the overlapped portion 14a in the peripheral circuit area 3, in the area corresponding to the upper area bordered by the segment N–N' in FIG. 9.

Then, the contact hole 31, for partially exposing the surface of the (titanium) silicide layer 18 on the diffused impurity layer 14 to the insulating interlayer 19 and the BPSG film 35, and the contact hole 32, for partially exposing the surface of the titanium-silicide layer 18 on the source/drain 17, are formed, followed by formation of the tungsten (W) plug 34 for filling these contact holes and the formation of the metal wiring 33 for connecting the bit line 11 with the selection transistor through the diffused impurity layer 14 and the source/drain 17.

A manufacturing process of the non-volatile memory according to this embodiment will be described in the following. FIG. 11A–FIG. 14C are schematic sectional views sequentially showing steps of the manufacturing process according to this embodiment. The pairs of FIG. 12A and FIG. 12B, FIG. 13A and FIG. 13B, FIG. 13C and FIG. 13D, FIG. 14B and FIG. 14C respectively show the same steps of the process differing by sampled section.

Figure 11A:
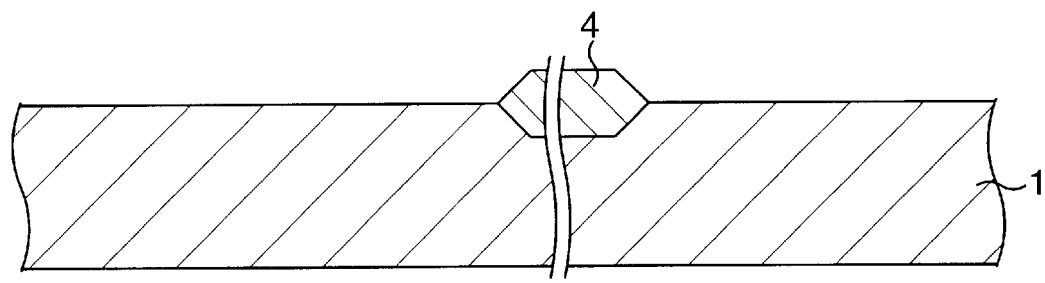
FIG. 11A is a schematic sectional view along I–I' line showing a manufacturing process of the non-volatile memory according to the second embodiment.

First, as shown in FIG. 11A, a field silicon dioxide film 4 having a thickness of about 200 nm–500 nm is formed by selective oxidation method and LOCOS method on the surface of a p-type silicon substrate 1 (SOI substrate may be substituted) for separating the memory cell array area 2 and the peripheral circuit area 3 from each other. This embodiment differs from the first embodiment in that the memory cell array area 2 and the peripheral circuit area 3 are completely separated from each other by the field silicon dioxide film 4. In this case, so-called STI (Shallow Trench Isolation) element isolation method designed for embedding an insulator in a trench provided in the element isolation area may be employed.

Figure 11B:
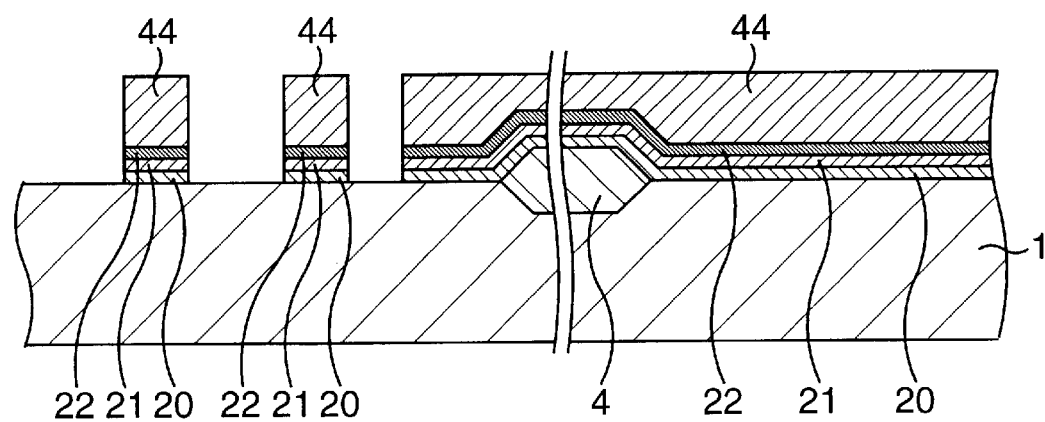
FIG. 11B is a schematic sectional view along I–I' line showing a manufacturing process of the non-volatile memory according to the second embodiment subsequent to that of FIG. 11A.

Next, as shown in FIG. 11B, the first silicon dioxide film 20 to a thickness of about 5 nm–10 nm at 900° C. by thermal oxidation method, the storage silicon nitride film to a thickness of about 6 nm–12 nm by CVD method and the second silicon dioxide film to a thickness of about 4 nm–10 nm at 1000° C. by thermal oxidation method are formed sequentially, followed by formation of the resist pattern 44 only partially opening on the memory cell array area 2 (In this case, oblique ion implantation may be applied to the surface layer of the substrate 1 by using boron (B) with an accelerating energy of 60 keV and a dose of $2 \times 10^{13}$–$5 \times 10^{13}/cm^2$) and dry etching of the first silicon dioxide film 10, the storage silicon nitride film 21 and the second silicon dioxide film 22.

Figure 12A:
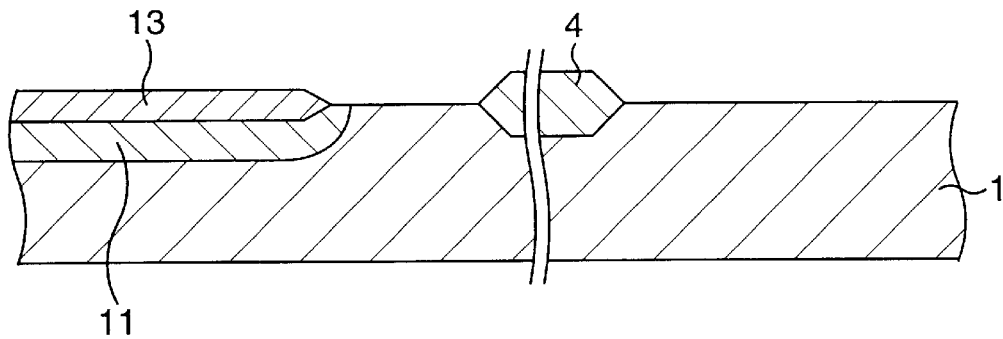
FIG. 12A is a schematic sectional view along I–I' line showing a manufacturing process of the non-volatile memory according to the second embodiment subsequent to that of FIG. 11B.
Figure 12B:
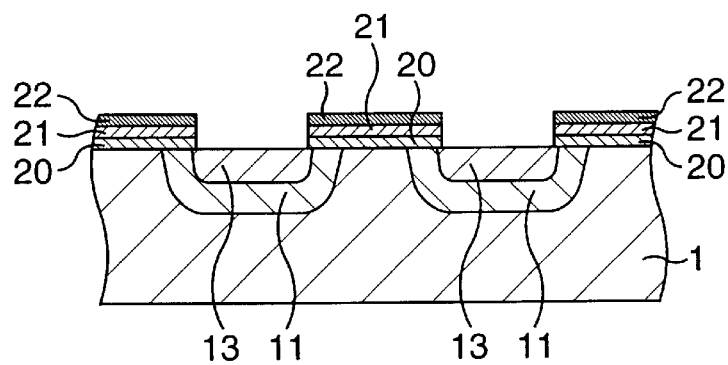
FIG. 12B is a schematic sectional view along III–III' line showing a manufacturing process of the non-volatile memory according to the second embodiment subsequent to that of FIG. 11B.

Subsequently, as shown in FIG. 12A and FIG. 12B, in order to form the bit line 11, which serves as the source/drain too, with the resist pattern 44 used as masking, ion implantation is made by using n-type impurities, e.g., arsenic (As) in this case, with an accelerating energy of 50 keV and a dose of $2 \times 10^{15}$–$5 \times 10^{15}/cm^2$. Then, the resist pattern 44 is removed, and the insulation layer 4 having a thickness of about 50 nm–200 nm is formed at 800° C. on the bit line 11 by thermal oxidation method.

Then, dry etching is applied to the first silicon dioxide film 20, the storage silicon nitride film 21 and the second silicon dioxide film 22 only in the peripheral circuit area 3 including the connecting portion between the memory cell array area 2 and the peripheral circuit area 3 bordered by the segment N–N' shown in FIG. 9 (upper area in FIG. 9). Thus, the films 20–22 remain on the memory cell array area not including the above-mentioned portion thereof.

Figure 12C:
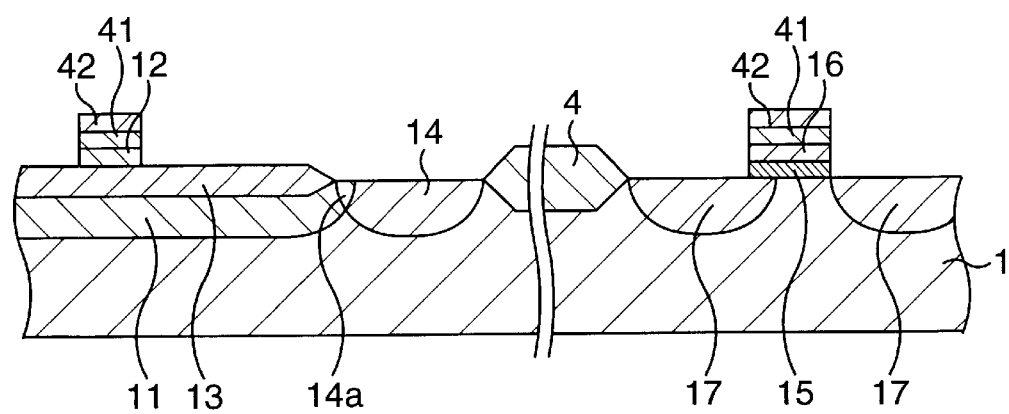
FIG. 12C is a schematic sectional view along I–I' line showing a manufacturing process according to the second embodiment subsequent to that of FIG. 12A (FIG. 12B)

Subsequently, as shown in FIG. 12C, after forming a gate insulating film 15 having a thickness of about 5 nm to 18 nm on the peripheral circuit area 2 through a thermal oxidation process at 900° C., a polycrystalline silicon film, to serve as the word line 12 and the gate electrode 16, is formed to a thickness of about 70 nm–150 nm covering the whole surface, and diffusion doping by using n-type impurities, e.g., phosphorus (P) in this case, is made for obtaining the resistance of about 100 Ω.cm. In this case, an amorphous silicon film doped with phosphorous may be substituted for the polycrystalline silicon film. Then, the tungsten silicide film 41 having a thickness of about 100 nm–180 nm is formed thereon, and a plasma silicon nitride-oxide film 42 for preventing the reflection from the resist and having a thickness of about 30 nm–150 nm is formed thereon, followed by resist patterning. Then, dry etching is applied to the polycrystalline silicon film, the tungsten silicide film 41 and the plasma silicon nitride-oxide film 42.

Subsequently, in order to form the diffused impurity layer 14 and the source/drain 17 of the selection transistor for the connecting portion between the memory cell array area 2 and the peripheral circuit area 3, ion implantation is applied by using n-type impurities, e.g., phosphorus (P) in this case, with an accelerating energy of 40 keV and a dose of $2 \times 10^{13}$–$4 \times 10^{13}/cm^2$. In this embodiment, since the memory cell array area 2 and the peripheral circuit area 3 are completely separated by the field silicon dioxide film 4, the connecting portion is provided in the memory cell array area 2.

Figure 13A:
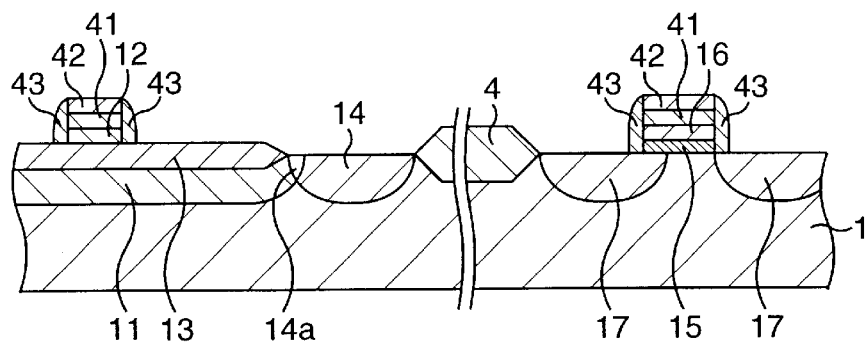
FIG. 13A is a schematic sectional view along I–I' line showing a manufacturing process of the non-volatile memory according to the second embodiment subsequent to that of FIG. 12C.
Figure 13B:
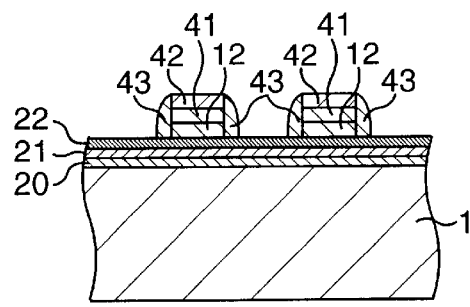
FIG. 13B is a schematic sectional view along IV–IV' line showing a manufacturing process of the non-volatile memory according to the second embodiment subsequent to that of FIG. 12C.

Subsequently, as shown in FIG. 13A, after accumulating the silicon dioxide film to a thickness of about 70 nm–150 nm on the whole surface by CVD method, anisotropic etching (etch-back) is applied to the whole surface to form a sidewall spacer 43. In this case, as shown in FIG. 13B, one or more insulating films of the first silicon dioxide film 20, the storage silicon nitride film 21 and the second silicon dioxide film 22 are kept remaining on the memory cell portion along IV–IV' line.

Subsequently, ion implantation is applied to the connecting portion between the memory cell array area 2 and the peripheral circuit area 3 by using n-type impurities, e.g., arsenic (As) in this case, with an accelerating energy of 60 keV and a dose of $2 \times 10^{15}$–$4 \times 10^{15}/cm^2$ to form a diffused impurity layer 14 and the selection transistor. In this case, one end of the diffused impurity layer constituting the bit line 11 and one end of the diffused impurity layer 14 are connected by being overlapped with each other.

Figure 13C:
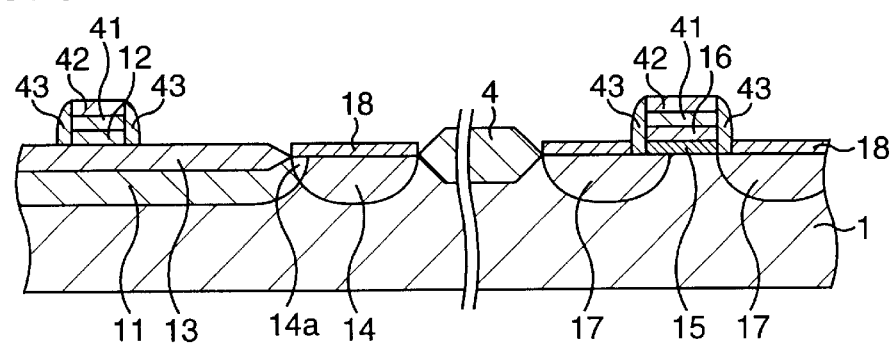
FIG. 13C is a schematic sectional view along I–I' line showing a manufacturing process of the non-volatile memory according to the second embodiment subsequent to that of FIG. 13A (FIG. 13B)

Subsequently, as shown in FIG. 13C, the film of a metal having a high melting point, e.g., titanium (Ti) in this case, is formed to a thickness of 20 nm–30 nm by the sputtering method. Then, after Si and Ti are subjected to a heat treatment process at, for example, 700° C., for letting them to react with each other, and the layer left without reaction is subjected to the etch-backing process and the heat treatment process at 800° C. to form a titanium silicide layer 18 on the surface of the diffused impurity layer 14 and the surface of the source/drain 17. In this case, the cobalt silicide layer may be substituted for the titanium silicide.

Figure 13D:
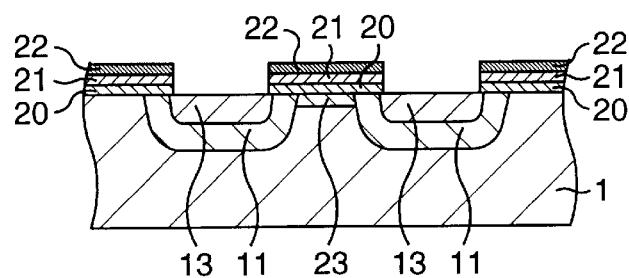
FIG. 13D is a schematic sectional view along III–III' line showing a manufacturing process of the non-volatile memory according to the second embodiment subsequent to that of FIG. 13A (FIG. 13B)

In this embodiment, as shown in FIG. 13D, since the insulating film of one of the first silicon dioxide film 20, the storage silicon nitride film 21 and the second silicon dioxide film 22 remains in the area above the III–III' line in the figure (between the neighboring bit lines 11) of memory cell array area 2, the silicide will not be formed on the memory cell array area 2.

Figure 14A:
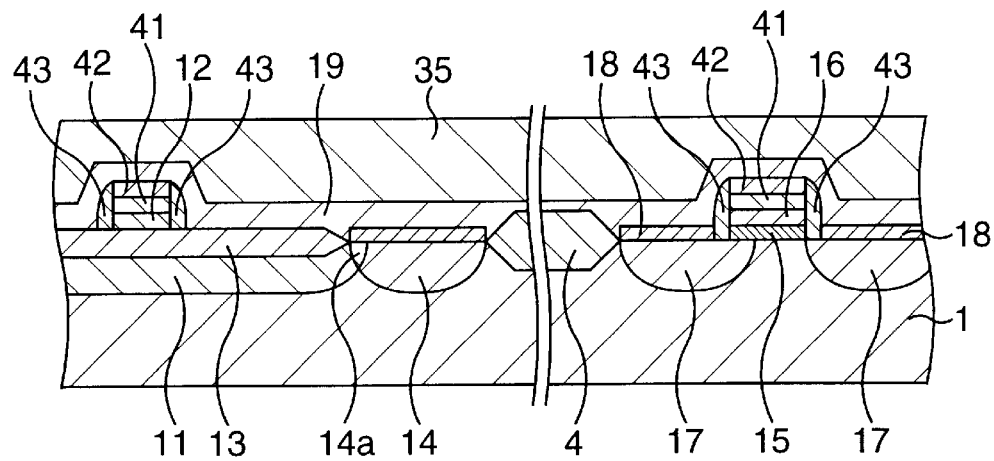
FIG. 14A is a schematic sectional view along I–I' line showing a manufacturing process of the non-volatile memory according to the second embodiment subsequent to that of FIG. 13C (FIG. 13D)

Subsequently, as shown in FIG. 14A, an insulating interlayer 19 and a BPSG film 35 are formed to a thickness of about 50 nm–150 nm and a thickness of about 400 nm–1000 nm respectively by CVD method.

Figure 14B:
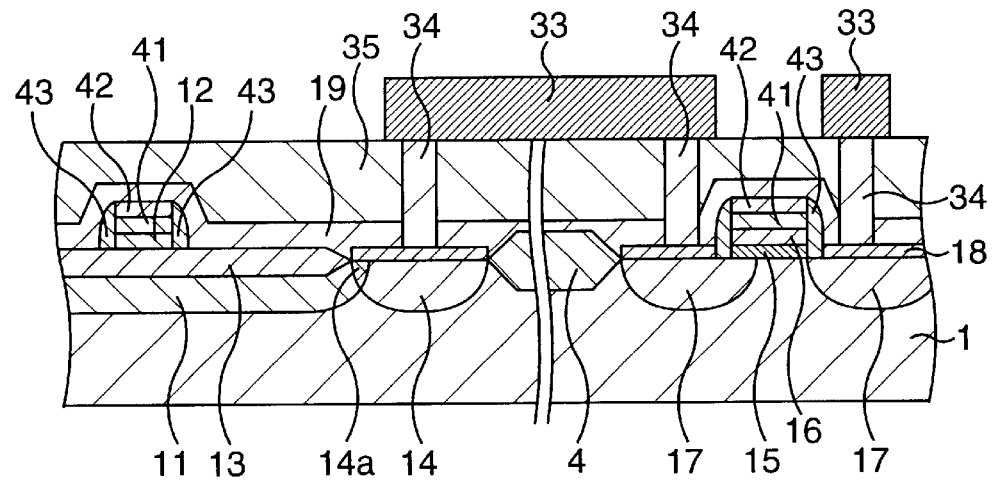
FIG. 14B is a schematic sectional view along I–I' line showing a manufacturing process of the non-volatile memory according to the second embodiment subsequent to that of FIG. 14A.
Figure 14C:
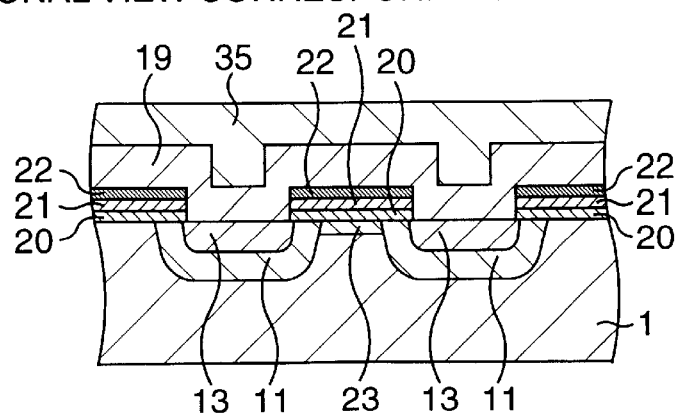
FIG. 14C is a schematic sectional view along III–III' line showing a manufacturing process of the non-volatile memory according to the second embodiment subsequent to that of FIG. 14A.

Subsequently, as shown in FIG. 14B and FIG. 14C, after resist patterning, contact holes 31 and 32 are formed by dry etching, and tungsten 34 to be buried is formed, followed by formation of metal wiring 33 by using an aluminum alloy.

Then, similarly to the case of an ordinary MOS integrated circuit, multilayer metal wiring is provided, and a surface passivation film is formed to complete a non-volatile memory.

As described in the foregoing, the non-volatile memory having the buried bit line structure according to this embodiment not only enables the silicide to be formed only on the peripheral circuit area 3 (and logic circuit area) with ease and less number of processing steps but also prevents a problem arising from that the silicide layer 18 is present on the exposed surfaces of the openings in the contact holes 31 and 32, since the memory cell array area 2 and the peripheral circuit area 3 are connected with each other by the diffused impurity layer 14. Further, since the silicide is formed on the overlapping portion between the diffused impurity layer constituting the bit line 11 and the diffused impurity layer 14, the increase in the resistance can be suppressed. In this way, according to this embodiment, various problems resulting from the buried bit line structure can be solved for sure formation of the silicide leading to the realization of a highly reliable non-volatile memory featuring a low resistance, a greater fineness and a high speed operation.

Further, in the cases of the first and second embodiments, the following variations are available.

(1) Silicidizing the diffused impurity layer of the peripheral circuit area 3 (and the logic circuit area) or the diffused impurity layer of the gate electrode, while silicidizing or polysidizing the word line 12 of the memory cell array area 2.

(2) Forming the silicon nitride film or the nitrified oxide film on each gate electrode not only for preventing the reflection at the time of the exposure to the light but also for letting it function as the etching stopper to obtain a desired etching.

What is claimed is:

1. A semiconductor memory device having a memory cell array area in which a word line and a bit line extend so as to cross each other with an insulating layer being interposed between them, and a memory cell is connected to one bit line and one word line as decided uniquely, and a peripheral circuit area including a selection transistor for said memory cell, said device comprising:

a first impurity diffusion region formed under said insulating layer, to serve as said bit line;

a second impurity diffusion region in the interconnecting portion between said memory cell array area and said peripheral circuit area, said second impurity diffusion region being connected to said first impurity diffusion region in the manner that said second impurity diffusion region overlaps at its one end portion with said first impurity diffusion region; and silicide layers formed on the surface of said second impurity diffusion region including the overlapping portion, and surfaces of third impurity diffusion regions to serve as the source and drain of said selection transistor.

2. A device according to claim 1, wherein part of said second impurity diffusion region is formed in common with one of said third impurity diffusion regions.

3. A device according to claim 1, wherein said second impurity diffusion region is formed independently of said third impurity diffusion regions.

4. A device according to claim 1, wherein said memory cell and said selection transistor are connected to each other in the manner that said second impurity diffusion region and one of said third impurity diffusion regions are connected through the corresponding silicide layer as an interconnection layer.

5. A device according to claim 1, wherein the gate electrode structure of said memory cell comprises a first insulating film, a storage nitride film for storing electric charges, a second insulating film, and said word line stacked in this order.

6. A device according to claim 5, wherein at least one of said first insulating film, said storage nitride film, and said second insulating film, is formed between neighboring bit lines.

7. A device according to claim 1, wherein a silicide layer is formed on said peripheral circuit area but no silicide layer exists on any impurity diffusion region in said memory cell array area.

8. A device according to claim 1, further having a logic circuit area including a predetermined transistor with a silicide layer.

* * * * *